United States Patent [19]

Garth et al.

[11] Patent Number: 4,658,137
[45] Date of Patent: Apr. 14, 1987

[54] ELECTRON DETECTOR

[75] Inventors: Simon C. J. Garth; William C. Nixon, both of Cambridge, United Kingdom

[73] Assignee: Texas Instruments Incorporated, Dallas, Tex.

[21] Appl. No.: 662,001

[22] Filed: Oct. 18, 1984

[30] Foreign Application Priority Data

Oct. 17, 1983 [GB] United Kingdom ................. 8327737

[51] Int. Cl.$^4$ ........................................... H01J 37/26
[52] U.S. Cl. ..................................... 250/310; 250/305
[58] Field of Search ........ 250/305, 310, 397, 396 ML, 250/398, 399

[56] References Cited

U.S. PATENT DOCUMENTS

| | | | |
|---|---|---|---|
| 3,474,245 | 10/1969 | Kimura et al. | 250/397 |
| 3,717,761 | 2/1973 | Koike et al. | 250/396 ML |
| 3,760,180 | 9/1973 | Weber | 250/305 |
| 3,822,382 | 7/1974 | Koike | 250/305 |
| 4,442,355 | 4/1984 | Tamura et al. | 250/310 |
| 4,514,682 | 4/1985 | Feurbaum | 250/310 |

Primary Examiner—Bruce C. Anderson
Assistant Examiner—Paul A. Guss
Attorney, Agent, or Firm—N. Rhys Merrett; Mel Sharp

[57] ABSTRACT

Electron detector apparatus and method for detecting secondary electrons released from a body, of particular utility in testing integrated circuits in an operational state. The apparatus utilizes a magnetic lens having an axis of symmetry, for producing a magnetic field that progressively weakens along the axis, so that the secondary electrons travel through the magnetic lens in progressively elongated helical paths and approach an electron retarding means, for example a planar grid, at approach angles to the direction of the axis such that their approach speeds along the axis are substantially equal to their actual speeds. The secondary electrons are collected after passage through the retarding means. Alternatively, the secondary electrons may be directed through a magnetic lens having an axis of symmetry to focus them at a small region at one end of the lens on which a part spherical electron retarding electrode is centered, such that the focussed secondary electrons proceed along radial paths to the retarding electrode, such that their approach speeds are substantially equal to their actual speeds.

26 Claims, 2 Drawing Figures

ELECTRON DETECTOR

This invention relates to an electron detector for analysing the energies of received electrons, especially but not exclusively, secondary electrons emitted by a target object in response to electron beam bombardment.

It has been proposed to test an integrated circuit by bombarding the circuit with an electron beam whilst voltages are being applied to the circuit. It has been found that the secondary electrons emitted by the parts of the circuit as a result of the electron beam bombardment have energies which indicate the voltages of the parts of the circuits from which they are emitted. Thus by positioning or scanning an electron beam over the circuit whilst it is in operation and detecting the secondary electrons emitted from it, the voltages which occurred in the circuit during operation can be evaluated.

A difficulty which has been encountered when carrying out such a test of integrated circuit is that the fields resulting from voltages on adjacent parts of the circuit can cause the secondary electrons emitted to be deflected through a significant angle. The majority of detectors used hitherto for detecting the secondary electrons have been constructed so as to be responsive to the velocity of those electrons normal to the plane of the circuit, so that under the circumstances just described considerable errors in the apparent electron velocity measured may result. This interaction between the parts of the circuit preventing a true measurement of the voltages in it being obtained is clearly a disadvantage. An attempt has been made to overcome the difficulty using high voltage electrodes near the circuit to draw up the electrons but the high voltages have given rise to undesirable charges being built up on the surface of the circuit under test.

It is an object of the present invention to overcome at least partially the difficulty described above.

According to the present invention there is provided an electron detector for detecting secondary electrons emitted from a body bombarded by an electron beam having a magnetic lens, the magnetic field of which is such that the secondary electrons are constrained and directed by the magnetic field to a collector assembly having retarding grid means, and wherein the collector assembly is so constructed and the magnetic lens is so arranged relatively thereto to control the paths of the secondary electrons so that they approach the retarding grid means of the collector assembly at a sufficiently small angle to the normal that their approach speeds are substantially equal to their actual speeds.

The detector may be used to analyse the energies of secondary electrons emitted from an integated circuit bombarded by an electron beam. The magnetic lens may have with it an electrostatic accelerator for speeding the passage of the secondary electrons emitted from the circuit on test through the magnetic lens and an electrostatic retarder for slowing down the extracted secondary electrons to velocities close to their emission velocities when they reach the retarding grid which is used to assess the energies of the electrons.

The primary electron beam for effecting the bombardment may be generated by an electron gun co-axial with the magnetic lens so that the beam passes through the magnetic lens to a circuit under test. Deflection means for the electron beam which may be electrostatic or magnetic may be provided in the electron gun itself or near the aperture.

A detector according to the invention can be used for analysing the energies of secondary electrons from any suitable body and is not limited in its application to the testing of integrated circuits.

The magnetic lens may be arranged to focus the secondary electrons to a small region at the center of a part-spherical retarding grid means of the collector assembly so that the secondary electrons approach the retarding grid means substantially normally. The retarding grid means may be hemispherical and it may have an aperture through which the electron beam can be directed to the body. Alternatively, the body may be located at or near the region of maximum field strength of the magnetic lens and the lens arranged so that the field strength becomes steadily weaker along the path of the secondaray electrons until they reach a region of substantially constant field strength considerably weaker than the maximum field strength, within which region the retarding grid means is located. The secondary electrons are accelerated by an attracting electrode to increase their speed of passage through the magnetic lens and then slowed down by a suitable electrostatic field so that their energies on reaching the retarding grid means are substantially the same as when they were emitted from the body. In such a magnetic field the secondary electrons emitted by the body are constrained to move in helical paths which become elongated as the field strength becomes weaker, so that their paths are at only a small angle to the axis of the helices in the weaker field strength region. Planar retarding grid means are provided in the weaker field strength region and allow only those secondary electrons with sufficient energy to pass. A collector having a positively charged attracting electrode will collect the electrons passing the retarding grid means. It is not necessary to provide an accelerating electrostatic field to accelerate the secondary electrons through the magnetic lens but the response of the detector is enhanced by its use.

The electron beam bombarding the body may be directed through the magnetic lens to the body.

In one embodiment, the magnetic lens is axially symmetrical with the primary electron beam being directed along a path close to the axis, and has a core of magnetic material with a central pillar extending upwardly from the bottom and on which the body is placed. An energising winding for the lens is wound round the pillar. The core continues outside the winding and extends above the top of the pillar so that the body is located at the region of highest field strength of the lens. The magnetic field lines extend upwardly away from the pillar and diverge as the field weakens. The effect of this weakening field is to cause the helical paths of secondary electrons emitted by the body to become elongated in the direction of the axis and therefore more nearly parallel so that the energies of the secondary electrons can be measured accurately.

By way of exmaple only, embodiments of the invention suitable for use with integrated circuit devices will now be described in greater detail with reference to the accompanying drawings of which:

Figure 1:
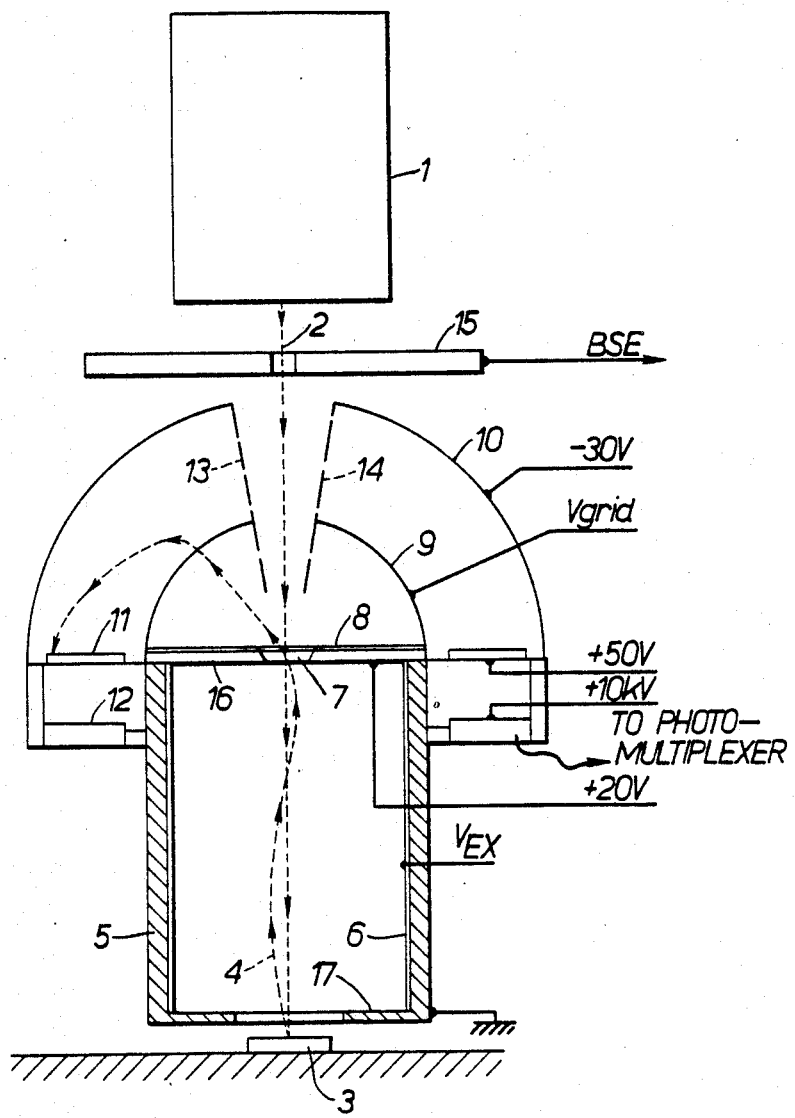
FIG. 1 shows the first embodiment in diagrammatic form only.

In FIG. 1, an electron gun 1 produces a beam 2 of primary electrons which are directed down the axis of the detector to a target sample 3 which is an integrated circuit. Secondary electrons 4 are emitted by the sample 3 as a result of the electron bombardment and these secondary electrons are constrained and directed by the magnetic field of a generally cylindrical magnetic lens 5 to pass through an aperture 7. The sample target 3 is itself exposed to the magnetic field of the lens. The secondary electrons are drawn away from the sample 3 by an extraction electrostatic field produced by a voltage $V_{EX}$ which is applied to a resistive coating 6 on the inside of the generally cylindrical magnetic lens 5. The resistive coating 6 is made, for example, of carbon or some other electrically resistive low atomic number material.

The secondary electrons 4 passing through the aperture 7 are then subjected to a spherically symmetrical retarding or filtering field produced by a voltage $V_{GRID}$ applied to a retarding grid or filter 9 and the circularly symmetrical voltage distribution on a resistive coating 8 on top of the upper annular disc 16 bounding the magnetic lens 5. The disc 16 has the aperture 7 at its centre. The aperture 7 is also located at the centre of the hemispherical retarding grid 9 thereby ensuring as far as possible, that secondary electrons approach the grid 9 in substantially radial directions. The speed of approach of the secondary electrons to the grid 9 is thus substantially equal to the actual speed of the secondary electrons.

Thus secondary electrons having sufficient energy to do so pass through the grid 9 and enter the space between the grid 9 and a hemispherical suppressor grid 10 concentric with the grid 9 about the aperture 7. The suppressor grid 10 is maintained at a substantial negative potential of $-30$ volts so as to keep the received secondary electrons within the space between the grids 9 and 10 but allow a passage for back-scattered and high energy secondary electrons.

An annular grid 11 also concentric with the aperture 7 is maintained at $+50$ volts and attracts the secondary electrons entering the space between the grids 9 and 10. This grid draws the electrons down and accelerates them towards a scintillation apparatus 12 also of annular form and below the grid 11. The grid in the scintillation apparatus is maintained at a very high potential of $+10$ kV so that a bright light output is obtained from the apparatus which is applied to a photomultiplier, not shown. The photomultiplier produces an electrical output representing the rate of collection of secondary electrons and from this can be obtained an indication of the effective voltages in the scanned parts of the integrated circuit.

As will be apparent from FIG. 1, the hemispherical collector assembly is co-axial with the cylindrical magnetic lens 5 and the grids 9 and 10 have circular apertures on the axis. These apertures are to provide free passages for the electron beam 2 from the gun 1 and also permit back-scattered primary electrons to return close to the axis without being caught by the collector assembly.

The dashed lines 13 and 14 indicate a narrow conical region about the axis within which the back-scattered electrons are returned to an electrode 15 which catches them. The back-scattered electrons are distinct from the secondary electrons in that they are primary electrons which have been substantially reversed in their trajectories, whereas the secondary electrons are dislodged from the material of the sample 3 by the impact thereon of the primary electrons. It is possible that the back-scattered primary electrons could cause the emission of tertiary electrons by impact on parts of the detector.

The provision of the resistive layer 6 made from a low atomic number electrically resistive material such as carbon reduces the likelihood of emission of tertiary electrons. The annular end plates of the magnetic lens 5 which have the references 16 and 17 are respectively maintained at $+20$ volts and earthed, and function in conjunction with the extraction voltage $V_{EX}$ applied to the coating 6 to produce the required electrostatic accelerating and retarding fields for the secondary electrons.

The resistive coating 8 on the disc 16 is insulated from it over most of its area but is connected to it around the aperture 7, and the external circumference of the coating 8 is connected to the grid 9 so as to produce the required radial retarding field throughout the hemispherical interior of the grid 9 except, of course, for the part near the axis where the back-scattered primary electrons are expected to return.

In the operation of the apparatus shown in FIG. 1, it is of course located in a vacuum envelope to allow free movement of the electrons. The voltages shown are applied to the various parts and the sample 3 is placed on the axis of the detector just below the central hole at the bottom of the magnetic lens 5. The sample is connected up by means not shown for normal operation. The magntic lens 5 forms part of the focussing system of the electron beam 2 from the gun 1 so that the beam is focussed on the sample 3. The electron beam 2 may be scanned over the sample 3 or caused to impinge on a particular part of it if spot measurements are required. No means for deflecting the electron beam are shown in the Figure, but these may be either electrostatic or magnetic and may be included in the electron gun 1 or located near the aperture 7. The secondary electrons emitted by the sample 3 as a result of the bombardment of the beam 2 pass through the grid 11 and provided they are of the required energy level proceed to the scintillation apparatus 12, the light from which is measured by a photomultiplier, not shown, to produce an indication of the amount of electrons collected and thus of the voltages of the parts of the integrated circuit from which the secondary electrons emanate. The voltage $V_{GRID}$ on the grid 9 can be adjusted to change the strength of the retarding field in the hemispherical space within the grid 9, so that the energy of the secondary electrons can be determined. Any electrons having very high energies will pass through the grid 10 as well as the grid 9 if the voltage on the suppressor grid 10 is insufficient to stop them.

Preferably, the parts of the detector and in particular the grids 9 and 10 are made of material which has a low secondary emission so as to reduce as far as possible the number of tertiary electons created by back-scattered primaries.

The detector shown in FIG. 1 functions by constraining and directing the secondary electrons from the sample 3 towards the aperture 7 where they are subjected to a spherically symmetrical retarding or filtering field and then to an accelerating field so that the energy of the electrons can be determined accurately. Thus the deflection of the secondaries as a result of electrostatic and magnetic fields close to the surface of the sample 3 due to the currents and voltages in the sample itself has substantially no effect on the detection of the electrons by the detector. Surprisingly, the exposure of the working integrated circuit to an intense magnetic field has negligible effect on the operation of the circuit. Magnetic fields up to the order of 1 TELSA may be employed. It will be appreciated therefore that a detector in accordance with the invention can produce an accurate map of the voltage distribution in the sample 3.

Figure 2:
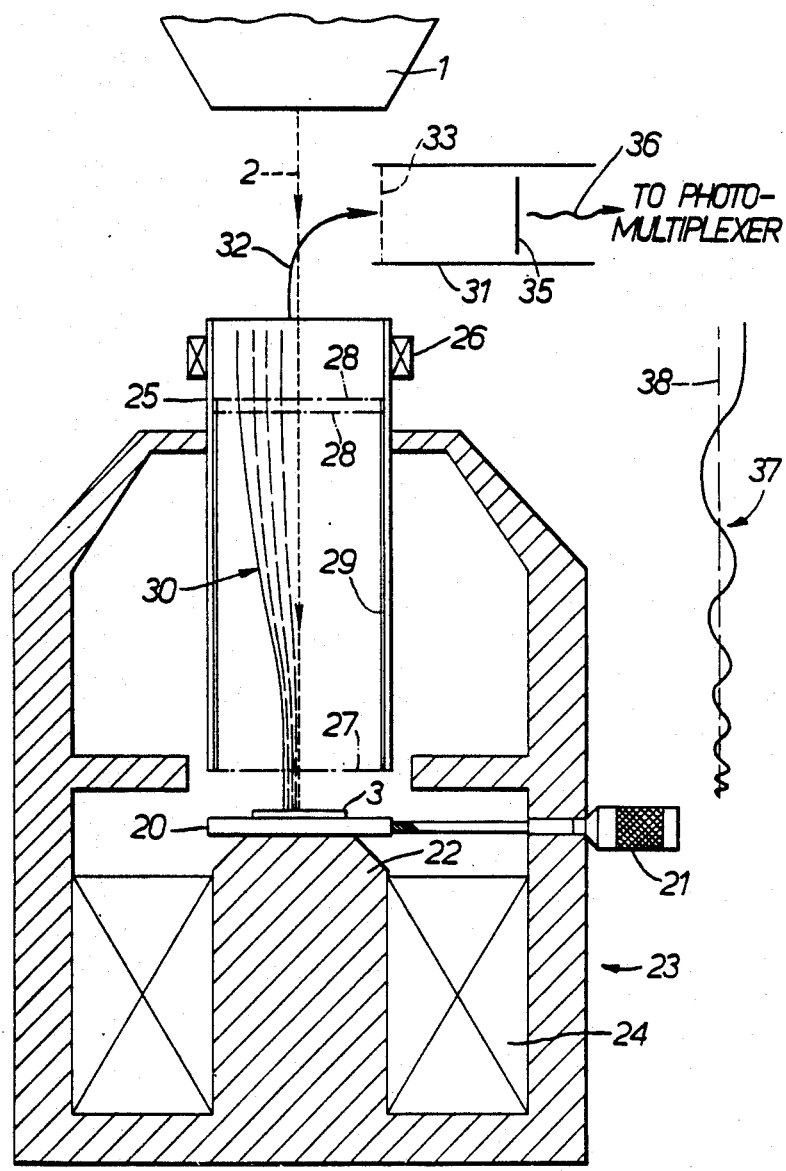
FIG. 2 shows the second embodiment in diagrammatic form only.

Whereas in FIG. 1 the secondary electrons are conveyed to a small region at the centre of a hemispherical collector system, the embodiment shown in FIG. 2 uses the magnetic lens to bring the paths of the secondary electrons to be substantially parallel so that they approach a planar collector close to the normal. In FIG. 2, the electron gun 1 produces a beam 2 of primary electrons which are directed down the axis of the detector to a target sample 3 which as in FIG. 1 is an integrated circuit.

The sample 3 is carried on a stage 20 which is movable under the control of a knob 21. The magnetic lens has a core of axial symmetry, a cross-section of which is indicated at 23 and includes an upstanding central pillar 22 on which the stage 20 is located. An energising winding 24 provides the magnetisation of the lens. As is shown in the Figure, the core 23 extends at the outside above the top of the pillar 22 and includes a central annulus around the sample 3.

A cylindrical tube 25 of insulating material extends down the top of the magnetic lens and has at its upper extremity a further winding 26 which is used to shape the magnetic field. A grid 27 carries a positive potential of about 100 volts to accelerate the electrons in their passage up the tube 15; this voltage is low enough not to affect the integrated circuit on the pillar 22. A grid 28, which may be double as shown, serves as the retarding or filtering grid.

A resistive coating 29 on the inside of the tube 25 provides the required electrostatic field for retarding the secondary electrons so that the latter approach the retarding grid 28 at substantially the same speeds as when they were emitted by the sample 3 —the emission speed. The field of the magnetic lens is represented by the lines 30 and is at its strongest in the vicinity of the sample 3 and is steadily weakened in an upward direction. The winding 26 serves to produce a substantially uniform field in the uppermost section of the tube 25 near the grid 28.

An electron responsive device 31 is located to one side of the axis of the detector and secondary electrons leaving the tube 25 in an upward direction are attracted as indicated by the arrow 32 by a grid 33 held at positive potential. The electrons pass to a scintillation plate 35 covered with a metal film biassed to about +1200 v. The light emitted by the plate 35 indicated by the arrow 36 is directed to a photomultiplier, not shown, which produces an output signal representing the intensity of the light output from the plate 35 produced by the impinging secondary electrons. In that manner an indication is obtained of the voltages in the integrated circuit.

In the operation of the detector shown in FIG. 2, which takes place under the conditions outlined above for the detector of FIG. 1, the secondary electrons emitted from the energised integrated circuit 3 as a result of the bombardment by the electron beam 2, are constrained and directed to helical paths around the axis by the magnetic field of the lens. As the electrons move upwards they are firstly accelerated by the electrostatic field and then slowed down again to their emission speeds. The gradual weakening of the magnetic field causes the electrons to follow progressively more elongated helical paths until at the top of the tube 25 the electrons are moving at an angle of not more than 5 degrees from the axis when they reach the retarding grid 28. A representation of the path of an electron is shown at 37, the axis of the detector being represented by the broken line 38. This illustration has not been located in its correct position along the axis of the detector for reasons of clarity of illustration. It will be understood that by bringing the paths of the secondary electrons to be within 5 degrees of the axis of the detector, their upward velocities are substantially unaffected by the angle at which they left the sample 3 because the cosine of 5 degrees is 0.9962. The effect of the magnetic lens is to change the direction of motion of the secondary electrons without affecting their speeds, so that a planar retarding or filtering grid can be used to filter the electrons according to their emission speeds.

Although the invention has been described with reference to specific examples and the application of those examples to the testing of integrated circuits, it will be appreciated that they could be used to determine the energies of secondary electrons from any other source of potential, for example nerve signals.

In other forms of the first embodiment of the invention, the collector assembly may be a larger or smaller section of a sphere than a hemisphere. The shape of the magnetic lens may differ from those shown provided that a correct form is retained for the magnetic field bearing in mind the form of the electron collector. Other means than the scintillation apparatus described may be used for producing an output from the collected electrons.

It is also possible to use an electrostatic plate or plates as the retarding or filtering grid and such alternatives are encompassed by the term "retarding grid".

We claim:

1. Electron detector apparatus for detecting secondary electrons released from a body; magnetic lens means having an axis of symmetry; means for supporting said body at a region of high field strength of said magnetic lens means; means for accelerating secondary electrons released from said body, through the magnetic lens means towards means for retarding said secondary electrons and classifying them according to their energies; said magnetic lens means for producing a magnetic field that progressively weakens along said axis from said accelerating means to said retarding means to cause said secondary electrons to travel through the magnetic lens means in progressively elongated helical paths to approach the retarding means at approach angles to the direction of said axis such that their approach speeds along the axial direction are substantially equal to their actual speeds.

2. Electron detector apparatus according to claim 1, including means for producing an electrostatic field to retard secondary electrons during their travel between the accelerating means and the retarding means.

3. Electron detector apparatus according to claim 1, including means for producing a localized region of constant field strength, considerably weaker than said high field strength, in which region said retarding means is located.

4. Electron detector apparatus according to claim 1, including means for collecting secondary electrons after passage through said retarding means.

5. Electron detector apparatus according to claim 1, wherein said electron retarding means comprises a planar grid disposed normally to the axis of symmetry of the magnetic lens means.

6. Electron detector apparatus for detecting secondary electrons released from a body; magnetic lens means having an axis of symmetry; means for supporting said body at a region of maximum field strength of said magnetic lens means; means for directing an electron beam through said magnetic lens means to bombard said body and release secondary electrons; means for accelerating secondary electrons released from said body to travel in an axial direction through said magnetic lens in a direction opposite from that of the electron beam; electron retarding means disposed in the path of secondary electrons after acceleration by the accelerating means; said magnetic lens means for producing a magnetic field that progressively weakens along said axis from the accelerating means toward said retarding means to cause said secondary electrons to travel in progressively elongated helical paths to approach the retarding means along paths substantially parallel to said axis.

7. Electron detector apparatus according to claim 6, wherein said electron retarding means comprises a planar grid disposed normally to the axis of symmetry of the magnetic lens means.

8. Electron detector apparatus according to claim 6, including a tube supporting the accelerating means and the retarding grid means; said tube having a resistive coating on its inner surface for producing an electrostatic field for retarding secondary electrons during travel through the tube between the accelerating means and the retarding means.

9. Electron detector apparatus according to claim 8, including a winding surrounding a localized portion of the tube and energizable to produce a localized region of substantially constant field strength, considerably weaker than said maximum field strength, in which the retarding means is located; the retarding means located between the accelerating means and said winding.

10. Electron detector apparatus according to claim 9, wherein the magnetic lens means includes a cylindrical wall of magnetizable material coaxially surrounding said tube.

11. Electron detector apparatus according to claim 10, wherein the cylindrical wall is upstanding from a base of magnetizable material and the magnetic lens means further includes an energization winding around a central pillar of magnetizable material upstanding from said base.

12. Electron detector apparatus according to claim 16, including means for collecting secondary electrons after passage through said retarding means.

13. Electron detector apparatus for detecting secondary electrons released from a body bombarded with an electron beam; magnetic lens means having an axis of symmetry; means for supporting said body at a region of high field strength of said magnetic lens means; means for accelerating secondary electrons released from said body to travel in an axial direction through said magnetic lens; planar electron retarding means disposed normal to said axis of symmetry in the path of secondary electrons accelerated by said accelerating means; said retarding means located between said accelerating means and means for producing a localized region of substantially constant field strength, considerably less than said high field strength, in which the retarding means is located; means for producing an electrostatic field for retarding said secondary elections during travel between the accelerating means and said retarding means; said magnetic lens means for producing a magnetic field that progressively weakens along said axis from the accelerating means toward said retarding means to cause said secondary elections to travel in progressively elongated helical paths to approach the planar retarding means along paths that are substantially parallel to said axis.

14. Election detector apparatus according to claim 13, wherein the magnetic lens means includes a unitary assembly having a central pillar and a surrounding cylindrical wall both upstanding from a base, the pillar, cylindrical wall and base made of magnetizable material, and an energization winding surrounding the pillar; wherein the means for supporting the body is located at the top of the pillar, and wherein the cylindrical wall surrounds the means for generating the retarding field.

15. Electron detector apparatus according to claim 13, including means for collecting secondary electrons after passage through said planar electron retarding means.

16. Electron detection apparatus for detecting secondary electrons released from a body; comprising magnetic lens means having an axis of symmetry; means for supporting said body at a region of high field strength of said magnetic lens means; a tube disposed coaxially with said axis of symmetry; electron accelerating means adjacent one end of the tube for accelerating secondary electrons released from the body to travel inside the tube in an axial direction through said magnetic lens; planar electron retarding means disposed across the tube toward the end of opposite said one end, normal to said axis of symmetry; said planar retarding means located between said accelerating means and an energizaton coil surrounding the tube for producing a localized region of substantially constant field strength, considerably weaker than said high field strength, in which said planar retarding means is located; a resistive coating on the inner surface of said tube for providing an electrostatic field for retarding said secondary electrons during travel between the accelerating means and the planar retarding means; said magnetic lens means for producing a magnetic field that progressively weakens along said axis from the accelerating means towards the planar retarding means to cause said secondary electrons to travel in progressively elongated helical paths to approach the planar retarding means at approach angles to the direction of the axis of symmetry sufficiently small that there is substantial equality between their approach speeds along the direction of the axis of symmetry and their actual speeds.

17. Electron detector apparatus according to claim 16, wherein the magnetic lens means has a core of magnetizable material comprising a cylindrical wall having a closed base supporting a central pillar within the cylindrical wall, and an energization winding surrounding the pillar; wherein said means for supporting the body is located at the top of the pillar, the cylindrical wall extends beyond the pillar and tapers inwardly to define an annular opening through which said tube projects.

18. Election detection apparatus according to claim 16, including electron collector means for collecting secondary electrons after passage through the planar electron retarding means.

19. A method of detecting secondary electrons emitted from a sample providing one or more energy sources; comprising the steps of bombarding at least parts of the sample with charged particles to release secondary electrons from at least some of said energy sources; accelerating the secondary electrons in an axial direction through an axially symmetric, progressively weakening magnetic field such that the secondary electrons travel in progressively elongated helical paths until their components of speed in the axial direction are substantially equal to their actual speeds and then retarding the secondary electrons to classify them according to their energies.

20. A method according to claim 19, wherein along their paths of travel between acceleration and classification, the secondary electrons are subjected to an electrostatic retarding field.

21. A method according to claim 19, wherein the secondary electrons are collected after they have been classified and used to generate electrical signals typifying the energy levels of the or each said source on the sample.

22. A method of testing on integrated circuit whilst in an operational mode comprising the steps of bombarding at least parts of the integrated circuit with charged particles to release secondary electrons from locations on said integrated circuit; accelerating the secondary electrons in an axial direction through an axially symmetric, progressively weakening magnetic field and subjecting the secondary electrons to a retarding field after thay have been accelerated, whereby the accelerated secondary electrons travel through the progressively weakening magnetic field in the progressively elongated helical paths until their actual paths of travel have become substantially parallel to the axis of symmetry; then classifying the energies of the secondary electrons and collecting the classified secondary electrons to provide signals indicative of electrical signal levels at locations on the integrated circuit from which said secondary electrons are released.

23. A method according to claim 22, wherein the integrated circuit is located in at a region of high magnetic field strength, and said classification is carried out in a localized region of constant field strength that is considerably weaker than said high field strength.

24. A method according to claim 22, including the step of subjecting the accelerated secondary electrons to an electrostatic retarding field such that they are classified when their speeds approximate their emission speeds.

25. Electron detector apparatus for detecting secondary electrons released from a body; cylindrical magnetic lens means; means for supporting said body at one end of said cylindrical lens means, said magnetic lens means for focussing said secondary electrons to a small region on the axis of the magnetic lens means opposite the end at which said supporting means is located; an annular electrode at said opposite end centered on said region and a resistive coating on the surface of said annular electrode more remote from said supporting means; means for biasing said annular electrode to a positive potential; a secondary electron retarding and collector assembly including a part spherical electron retarding electrode having a center located at said small region such that secondary electrons focussed on said small region thereafter travel along radial paths to approach said part spherical retarding means at speeds which are substantially equal to their actual speeds; and means for collecting secondary electrons that pass said retarding electrode.

26. Electron detector means according to claim 25, wherein said electron retarding and collector assembly also comprises a part spherical suppressor electrode outwardly concentric with said part spherical retarding electrode, and an annular electron collector electrode concentric with said small region located between said part spherical electrodes for collecting secondary electrons that pass said retarding electrode.

* * * * *